United States Patent
Chien et al.

(10) Patent No.: US 9,449,711 B2
(45) Date of Patent: Sep. 20, 2016

(54) SHIFT REGISTER CIRCUIT AND SHADING WAVEFORM GENERATING METHOD

(71) Applicant: AU Optronics Corporation, Hsin-Chu (TW)

(72) Inventors: Ling-Ying Chien, Hsin-Chu (TW); Kuang-Hsiang Liu, Hsin-Chu (TW); Yu-Hsin Ting, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 68 days.

(21) Appl. No.: 14/024,777

(22) Filed: Sep. 12, 2013

(65) Prior Publication Data
US 2014/0219412 A1    Aug. 7, 2014

(30) Foreign Application Priority Data
Feb. 7, 2013 (TW) .............................. 102104907 A (51) Int. Cl.
*G11C 19/00* (2006.01)
*G11C 19/28* (2006.01)
*G09G 3/36* (2006.01)

(52) U.S. Cl.
CPC .............. *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 7,697,655 B2* | 4/2010 | Chan et al. | 377/64 |
| 8,098,792 B2* | 1/2012 | Hsu et al. | 377/64 |
| 8,102,962 B2* | 1/2012 | Liu et al. | 377/64 |
| 8,199,870 B2* | 6/2012 | Shang et al. | 377/64 |
| 8,331,524 B2 | 12/2012 | Hsu et al. | |
| 2008/0012818 A1* | 1/2008 | Lee et al. | 345/100 |
| 2008/0219401 A1* | 9/2008 | Tobita | 377/79 |
| 2013/0265291 A1* | 10/2013 | Huang | 345/212 |
| 2014/0072093 A1* | 3/2014 | Shang et al. | 377/69 |
| 2014/0086379 A1* | 3/2014 | Ma et al. | 377/64 |
| 2014/0119490 A1* | 5/2014 | Yang et al. | 377/64 |
| 2014/0169518 A1* | 6/2014 | Kong et al. | 377/64 |
| 2014/0177780 A1* | 6/2014 | Qi et al. | 377/64 |
| 2014/0192039 A1* | 7/2014 | Wang et al. | 345/213 |
| 2014/0240209 A1* | 8/2014 | Zhang | 345/92 |
| 2014/0355731 A1* | 12/2014 | Chien et al. | 377/64 |

* cited by examiner

*Primary Examiner* — Tuan T Lam
(74) *Attorney, Agent, or Firm* — WPAT, PC; Justin King; Douglas Hosack (57) ABSTRACT

A shift register circuit and a shading waveform generating method are disclosed. The shift register circuit includes plural stages of shift registers. Each stage of the shift register includes an output transistor, an input unit and a gate-shading circuit. The output transistor is configured for generating an output signal of the stage of the shift register. The input unit is configured for controlling a voltage level on a gate terminal of the output transistor. The gate-shading circuit includes a first switch, a second switch and a third switch. The first switch is configured for outputting a control signal. The second switch is configured for pulling down the voltage level on the gate terminal of the output transistor according to the control signal. The third switch is configured for pulling down a level on an output terminal of the output transistor according to the control signal.

22 Claims, 9 Drawing Sheets

SHIFT REGISTER CIRCUIT AND SHADING WAVEFORM GENERATING METHOD

RELATED APPLICATIONS

This application claims priority to Taiwan Application Serial Number 102104907, filed Feb. 7, 2013, which is herein incorporated by reference.

BACKGROUND

1. Field of Invention

The invention relates to a circuit structure in a display. More particularly, the invention relates to a shift register circuit configured in a display, which can generate a shading waveform.

2. Description of Related Art

In a conventional liquid crystal display, data lines and scan lines perpendicularly go across each others and form a pixel matrix. Scan lines, which are electrically coupled to gates of display transistors in the liquid crystal display, are configured for controlling switching states of display transistors, so as to determine whether to write image signals into the display transistors or not.

When liquid crystal units arranged in the pixel matrix are charged, a gate driving signal will be influenced by varied impedances, which vary corresponding to how many pixel units (on the same row/column) the gate driving signal has been passed through in sequence. Accordingly, the gate driving signal will be distorted gradually, which may cause an inconsistency of charging voltages of pixel units at different positions (on the same row/column). For example, the gate driving signal received at a near terminal located adjacent to a gate-driving circuit can be different from the gate driving signal received at a far terminal located away from the gate-driving circuit. The inconsistency of the gate driving signal may cause a flickering problem on the display panel. To solve the flicker problem, the gate driving signal is usually formed with a shading waveform (e.g., a chamfered waveform) as a conventional solution. For example, a gate-shading module, which is added to between a time sequence controller and a gate circuit, is configured for shading the gate driving signal (e.g., into the chamfered waveform), so as to reduce the influence of unequal impedance over pixel units, and maintain consistency of the gate driving signal to different liquid crystal units. In this case, the charging voltages on the different pixel units can be equalized to solve the flicker problem.

Currently, the function of generating a gate-shading waveform is mostly provided by a gate driver IC (or by configuring a gate-shading circuit element within the gate driver IC). Therefore, the circuit board of display reserves some space to implement the gate-shading circuit along with (or within) the gate driver IC.

However, in an advanced Gate on Array (GOA) process, there is no additional gate driving circuit implemented independently. However, the function of the gate-driving circuit is integrated on the display panel, so as to reduce an area occupied by the gate-driving circuit and realize a narrow bezel on the display panel. In this case, it is important to realize the gate-shading function on the gate-driving waveform of the display panel with a simple circuit structure.

SUMMARY

In order to solve the aforesaid problem and form a shading waveform efficiently, the invention provides a gate-shading circuit in a shift register, wherein the gate-shading circuit of each stage of the shift register includes a plurality of switches. When the aforesaid switches are turned on, voltages on a gate terminal and an output terminal of an output transistor in the shift register can be pulled down respectively. The output transistor can be turned off gradually by pulling down the voltage on the gate terminal so as to change an output voltage; and additionally, a voltage level on the output terminal can be changed directly by pulling down the voltage on the output terminal (e.g., pulling down the voltage through a voltage-dividing method). By performing the aforesaid two methods at the same time, shading on an output signal is formed efficiently. In addition, when each stage of the shift register is not activated, a voltage stabilizing circuit is configured to ensure stability of voltage levels within the stage, so to avoid trigger errors on the shift register.

An aspect of the invention provides a shift register circuit, including a plurality of stages of shift registers. Each stage of the shift register includes an output transistor and a gate-shading circuit. The output transistor has a first terminal, a second terminal and a gate terminal. The first terminal of the output transistor is configured to receive a first clock signal and the second terminal of the output transistor is configured for generating an output signal of the stage of the shift register and providing the output signal to a next stage and/or a previous stage of the shift register. The gate-shading circuit includes a first switch, a second switch and a third switch. The first switch has a first terminal, a second terminal and a gate terminal. The first terminal of the first switch is configured for receiving a second clock signal, and the gate terminal of the first switch is electrically coupled to the gate terminal of the output transistor for controlling whether to conduct or cutoff between the first terminal and the second terminal of the first switch according to a voltage level of the gate terminal of the output transistor. The second switch has a first terminal, a second terminal and a gate terminal. The first terminal of the second switch is electrically coupled to the gate terminal of the output transistor, and the second terminal of the second switch is configured for receiving a first reference voltage. The gate terminal of the second switch is electrically coupled to the second terminal of the first switch. The third switch has a first terminal, a second terminal and a gate terminal. The first terminal of the third switch is electrically coupled to the second terminal of the output transistor, and the second terminal of the third switch is configured for receiving a second reference voltage. The gate terminal of the third switch is electrically coupled to the second terminal of the first switch.

Another aspect of the invention provides a shift register circuit, including a plurality of stages of shift registers. Each stage of the shift register includes an output transistor, an input unit, a gate-shading circuit and a voltage stabilizing circuit. The output transistor is configured for generating an output signal of the stage of the shift register at the second terminal of the output transistor according to a voltage level on the gate terminal of the output transistor and a voltage level on the first terminal of the output transistor. The input unit is electrically coupled to the output transistor and configured to control the voltage level on the gate terminal of the output transistor. The gate-shading circuit includes a first switch, a second switch and a third switch. The first switch is electrically coupled to the gate terminal of the output transistor and configured to output a control signal according to the voltage level on the gate terminal of the output transistor and the voltage level on the first terminal of the first switch. The second switch is electrically coupled to the gate terminal of the output transistor and configured to pull down the voltage level on the gate terminal of the output transistor according to the control signal. The third switch is electrically coupled to the output transistor and configured to pull down a voltage level on the second terminal of the output transistor according to the control signal. The voltage stabilizing circuit is electrically coupled to the gate terminal of the output transistor and the second terminal of the output transistor. When the stage of the shift register is not activated, the voltage stabilizing circuit is configured for maintaining the gate terminal of the output transistor and the output signal of the stage at a low voltage level.

A further aspect of the invention provides a shading waveform generating method used for a plurality of stages of shift registers. Each stage of the shift register includes an output transistor, a first switch, a second switch and a third switch. The output transistor is configured for generating an output signal of the stage of the shift register and providing the output signal to a next stage of the shift register. The shading waveform generating method includes: turning on the output transistor and pulling up a voltage level on an output terminal of the stage of the shift register through a first clock signal; turning on the second switch by the first switch through a second clock signal to discharge a voltage level on a gate terminal of the output transistor to reduce a conductive degree of the output transistor; and turning on the third switch by the first switch through the second clock signal to pull down the voltage level on the output terminal of the stage of the shift register.

DETAILED DESCRIPTION

A plurality of embodiments of the invention will be disclosed below with reference to drawings. For purpose of clear description, many details in practice will be described together with the following description. However, it should be understood that these details in practice are not used to limit the invention. In some embodiments of the invention, these details in practice are unnecessary. Additionally, for purpose of simplifying the drawings, some conventional and common structures and components in the drawings will be illustrated in a simple and schematic manner.

Figure 1:
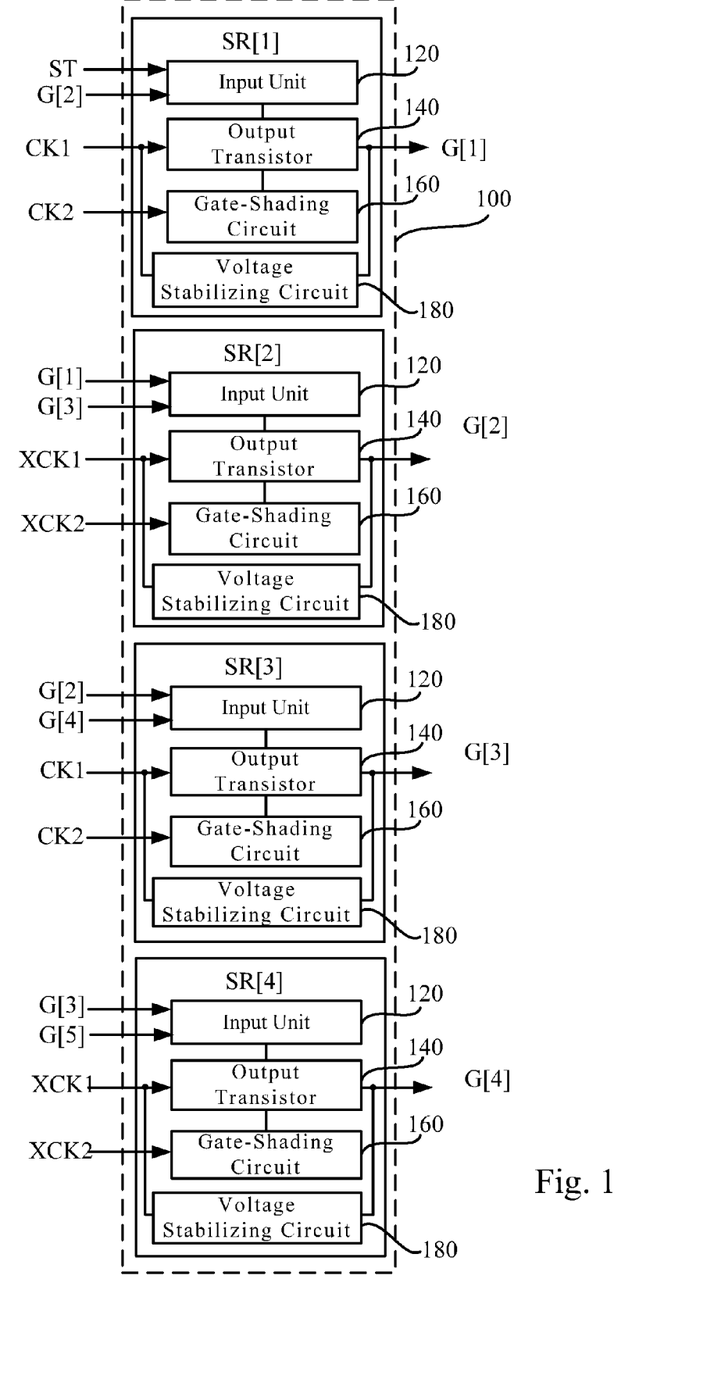
FIG. 1 illustrates a schematic view of a shift register circuit according to an embodiment of the invention.

Referring to FIG. 1, it illustrates a schematic view of a shift register circuit 100 according to an embodiment of the invention. The shift register circuit 100 includes a plurality of stages of shift registers. For example, in the embodiment as shown in FIG. 1, the shift register circuit 100 includes multiple stages of shift registers, such as shift registers SR[1], SR[2] and SR[3]. In an example of practical use, the shift register circuit 100 may be applied in a digital display as a gate driving circuit, which is configured for providing a gate driving signal used for time-division sequential driving (such as output signals G[1], G[2] and G[3] of shift registers in the drawings . . . ), configured for driving a pixel switch circuit on multiple scan lines. The function and operational method of the general gate driving circuit are well-known by those of skills in the art and thus they will not be described herein anymore.

Figure 2:
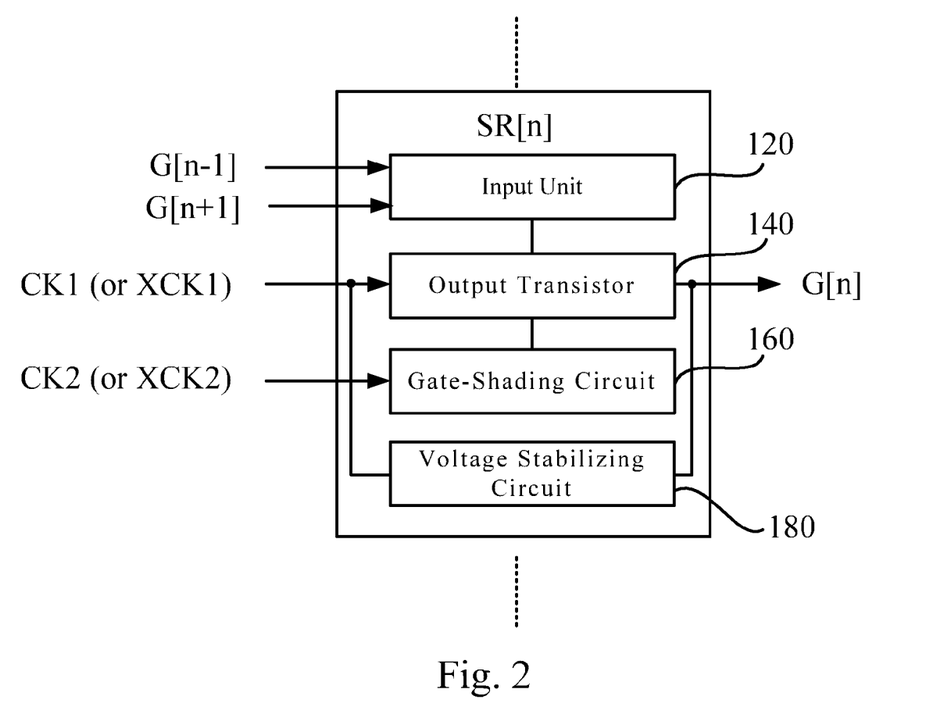
FIG. 2 illustrates a schematic view of a stage of the shift register in the shift register circuit in FIG. 1.

Referring to FIG. 2 at the same time, it illustrates a schematic view of a stage of the shift register G[n] of the shift register circuit 100 in FIG. 1. The shift register G[n] illustrated in FIG. 2 is a general expression formula for each stage of the shift register, wherein n is a positive integer.

In the embodiment as shown in FIG. 2, each stage of the shift register SR[n] included in the shift register circuit 100 includes an input unit 120, an output transistor 140 and a gate-shading circuit 160. In addition, each stage of the shift register SR[n] can further include a voltage stabilizing circuit 180.

A bi-direction scan shifting is exemplified for the shift register circuit 100 in the embodiments illustrated in FIGS. 1 and 2. In the embodiment, the input unit 120 of each stage of the shift register is connected to an output signal of a previous stage of the shift register and an output signal of a next stage of the shift register. For example, the input unit 120 of the shift register SR[2] receives an output signal G[1] of the previous stage of the shift register SR[1] and an output signal G[3] of the next stage of the shift register SR[3]; while the input unit 120 of the shift register SR[3] receives an output signal G[2] of the previous stage of the shift register SR[2] and an output signal G[4] of the next stage of the shift register SR[4]. The rest can be done in the same manner.

In the embodiment, the shift register circuit 100 of the bi-direction scan shifting can perform a forward scan shifting or a reverse scan shifting selectively. For example, the input unit 120 of each stage can be activated to form the forward scan shifting selectively according to the output signal of the previous stage of the shift register or can be activated to form the reverse scan shifting selectively according to the output signal of the next stage of the shift register.

The forward scan shifting is taken as an example. In the embodiments of FIGS. 1 and 2, the shift register SR[1] outputs the output signal G[1] at an enabling level which can trigger the shift register SR[2]; while the shift register SR[2] outputs the output signal G[2] at an enabling level which can trigger the shift register SR[3]. The rest can be done in the same manner. The sequential enabling output signals are further formed, such as G[1], G[2], G[3], . . . G[n] . . . and so on. An example of the reverse scan shifting changes the sequence of the scan which is well-known by those of skills in the art and will not be described herein anymore.

Figure 3:
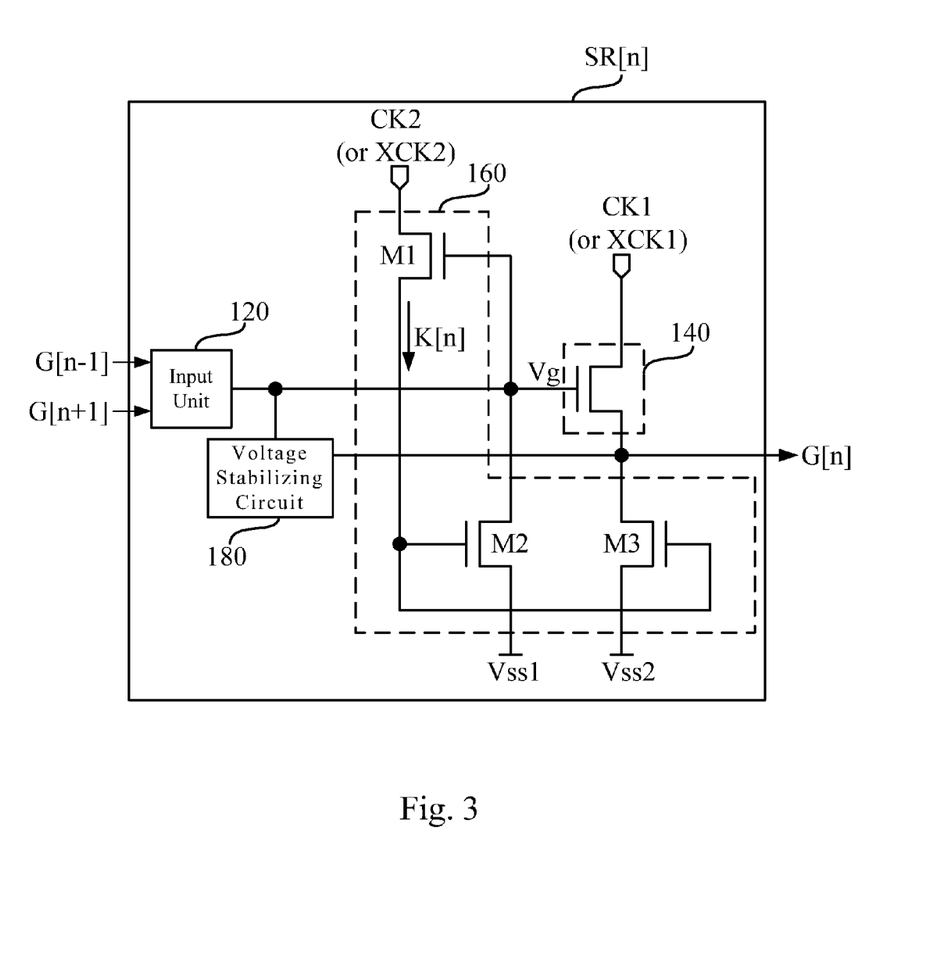
FIG. 3 illustrates an internal circuit schematic view of the shift register in FIG. 2.
Figure 4:
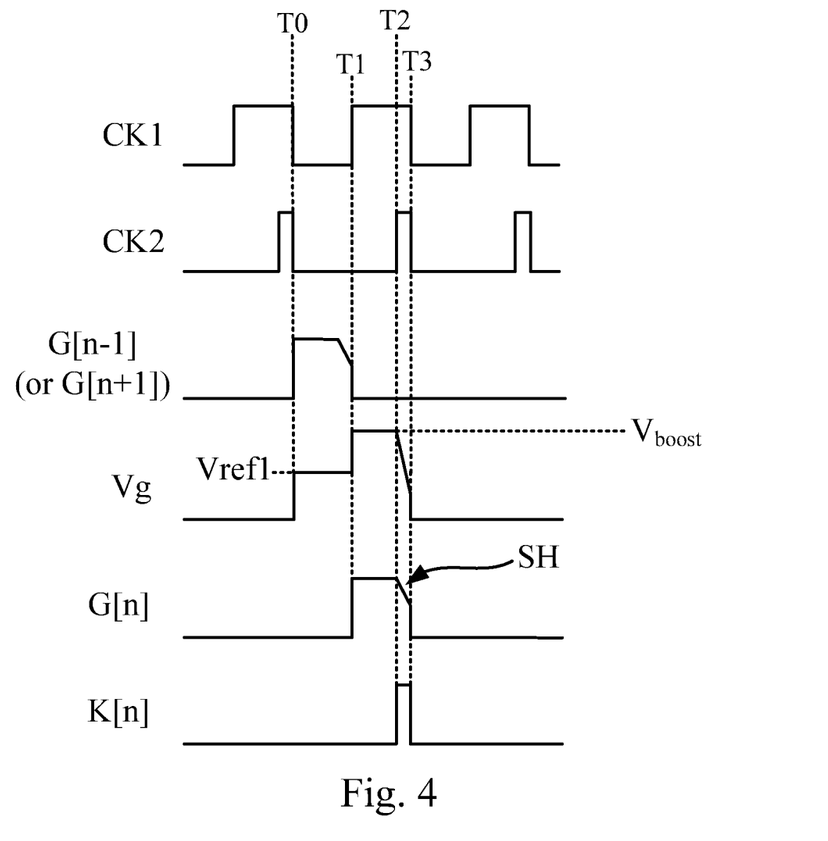
FIG. 4 illustrates a signal waveform diagram related to the shift register in FIG. 3.

Referring to FIGS. 3 and 4 at the same time, FIG. 3 illustrates an internal circuit schematic view of the shift register SR[n] in FIG. 2. The shift register SR[n] includes the input unit 120, the output transistor 140 and the gate-shading circuit 160. FIG. 4 illustrates a signal waveform diagram related to the shift register SR[n] in FIG. 3. In addition, each stage of the shift register SR[n] can include a voltage stabilizing circuit 180. As shown in FIG. 3, the voltage stabilizing circuit 180 in the shift register SR[n] is electrically coupled to a gate terminal of the output transistor 140 and a second terminal of the output transistor 140.

As shown in FIG. 3, the output transistor 140 has a first terminal, a second terminal and a gate terminal. The first terminal of the output transistor 140 receives a first clock signal. Herein, the first clock signal can be a clock signal CK1 or an antiphase clock signal XCK1. In the embodiment, the clock signal CK1 as the first clock signal received by the shift register SR[n] is mainly exemplified for description.

The second terminal of the output transistor 140 is configured for generating the output signal G[n] of the stage of the shift register SR[n], providing the output signal to a next stage of the shift register (e.g., providing the output signal to a next stage of the shift register SR[n+1], not shown) and providing the output signal to a previous stage of the shift register (e.g., providing the output signal to a previous stage of the shift register SR[n−1], not shown).

The gate-shading circuit 160 includes a first switch M1, a second switch M2 and a third switch M3. The first switch M1 has a first terminal, a second terminal and a gate terminal. The first terminal of the first switch M1 is configured for receiving a second clock signal. Herein, the second clock signal can be a clock signal CK2 or an antiphase clock signal XCK2. In the embodiment, the clock signal CK2 as the second clock signal received by the shift register SR[n] is mainly exemplified for description.

The gate terminal of the first switch M1 is electrically coupled to the gate terminal of the output transistor 140, thereby controlling whether the first switch M1 is turned on or turned off according to a voltage level on the gate terminal of the output transistor 140. And then, the first terminal and the second terminal of the first switch M1 are conducted to or cutoff from each other.

The second switch M2 has a first terminal, a second terminal and a gate terminal. The first terminal of the second switch M2 is electrically coupled to the gate terminal of the output transistor 140 and the second terminal of the second switch M2 is configured for receiving a first reference voltage Vss1. The gate terminal of the second switch M2 is electrically coupled to the second terminal of the first switch M1.

The third switch M3 has a first terminal, a second terminal and a gate terminal. The first terminal of the third switch M3 is electrically coupled to the second terminal of the output transistor 140 and the second terminal of the third switch M3 is configured for receiving a second reference voltage Vss2. The gate terminal of the third switch M3 is electrically coupled to the second terminal of the first switch M1.

In practical use, the first reference voltage Vss1 and the second reference voltage Vss2 can be system low voltages. The first reference voltage Vss1 and the second reference voltage Vss2 can be set with the same system low voltage level or two different system low voltage levels.

For the signal operation, the first switch M1 is configured for outputting a control signal K[n] in the shift register SR[n] according to the voltage level on the gate terminal of the output transistor 140 and the voltage level on the first terminal of the first switch (i.e., the second clock signal CK2). The control signal K[n] generated by the first switch M1 is transmitted to the gates of the second switch M2 and the third switch M3 so as to control whether the second switch M2 and the third switch M3 are turned on or turned off.

In other words, the second switch M2 pulls down/disable the voltage level on the gate terminal of the output transistor 140 selectively according to the control signal K[n]. The third switch M3 pulls down/disable the voltage level on the second terminal of the output transistor 140 selectively according to the control signal K[n].

In the embodiment, the first switch M1, the second switch M2 and the third switch M3 in the gate-shading circuit 160 are configured for performing a shading waveform generating method.

As shown in FIGS. 3 and 4, for the n stage of the shift register SR[n], the previous stage of the shift register (not shown) between a time point T0 and a time point T1 is activated and generates an output signal G[n−1]. The output signal G[n−1] generated by the previous stage of the shift register is inputted to the gate terminal of the output transistor 140 of the shift register SR[n] through the input unit 120 to increase a voltage Vg on the gate terminal of the output transistor 140 to a first voltage level Vref1 (as shown in FIG. 4) to turn on the output transistor 140. At this time, the first terminal of the output transistor 140 is still at a low level (the first clock signal CK1 from the time point T0 to the time point T1) and thus the output signal G[n] from the time point T0 to the time point T1 is not changed.

From the time point T1, the first clock signal CK1 is switched from a low level to a high level. When the output transistor 140 is turned on, the voltage level on the output terminal of the shift register SR[n] (the second terminal of the output transistor 140) is pulled up through the first clock signal CK1. In other words, the first clock signal CK1 at the high level is transmitted to the second terminal of the output transistor 140 through the output transistor 140 to form the output signal G[n] at the high level.

At the same time, the voltage level Vg on the gate terminal of the output transistor 140 is further increased from the first voltage level Vref1 to a boost voltage level $V_{boost}$ through a coupling capacitance of the output transistor 140 (such as a coupling capacitance Cgs between a gate and a source).

In this way, the first clock signal CK1 can form the output signal G[n] at the high level between the time point T1 and a time point T3, serving as the gate driving signal. Moreover, the gate-shading circuit 160 can form shading on the output signal G[n] (e.g., a chamfered waveform on of output signal G[n]).

In the embodiment, the second clock signal CK2 is designed to include a plurality of pulses and the pulses of the second clock signal CK2 correspond to clock negative edges of the first clock signal CK1.

From the time point T2 to the time point T3, i.e., before the clock negative edge of the first clock signal CK1 (the time point T3), the second clock signal CK2 is switched to the high level.

Therefore, from the time point T2 to the time point T3, the second clock signal CK2 at the high level forms the control signal K[n] at the high level through the first switch M1 and is transmitted to the gates of the second switch M2 and the third switch M3 to turn on the second switch M2 and the third switch M3.

From the time point T2 to the time point T3, the second switch M2 is to turned on by the control signal K[n] at the high level. The second switch M2 couples the gate terminal of the output transistor 140 to the first reference voltage Vss1. Since the second switch M2 is turned on, the voltage level Vg on the gate terminal of the output transistor 140 is discharged to reduce the conductive degree of the output transistor 140. In other words, the output transistor 140 is turned off gradually so that the voltage level on the second terminal of the output transistor 140 (i.e., the output signal G[n]) is reduced.

At the same time, from the time point T2 to the time point T3, through the control signal K[n] at the high level, the third switch M3 is turned on, thereby connecting the second terminal of the output transistor 140 to the second reference voltage Vss2 through the third switch M3 so as to pull down the voltage level on the second terminal of the output transistor 140 (i.e., the output signal G[n]).

In addition, from the time point T2 to the time point T3, the turning-on of the second switch M2 reduces the conductive degree of the output transistor 140 by changing the voltage level Vg on the gate terminal of the output transistor 140 to turn off the output transistor 140 gradually and reach an effect of reducing the voltage level of the output signal G[n]; at the same time, the turning-on of the third switch M3 realizes the effect of reducing the voltage level of the output signal G[n] in the voltage-dividing method by coupling the second terminal of the output transistor 140 to the second reference voltage Vss2. By the aforesaid method of turning off the output transistor 140 gradually and the voltage-dividing method together, a shading portion SH (as shown in FIG. 4) on the output signal G[n] is formed.

If only the third switch M3 is configured, the shading effect formed by the voltage-dividing method may be limited. A shading voltage on the output signal G[n] will be limited to an impedance proportion when the third switch M3 and the output transistor 140 are turned on. A particular size of the third switch M3 is needed to set (to form a particular conduction impedance) to realize the shading effect required efficiently.

In view of the above, when the second switch M2 and the third switch M3 in the gate-shading circuit 160 of the disclosure are turned on, they can pull down the gate terminal and the output terminal (i.e., the second terminal) of the output transistor 140 to form the shading on the output signal.

In addition, the time point at which the shading is formed by turning on the second switch M2 and the third switch M3 is determined by the second clock signal CK2 and the control signal K[n] generated by the first switch M1 in the gate-shading circuit 160. As shown in FIG. 4, a pulse width of the second clock signal CK2 is positively correlated to a shading width of the shading portion SH of the output signal G[n].

In order to increase the shading width of the shading portion SH, the second clock signal CK2 at the high level can be generated ahead of time or a duty cycle of the second clock signal CK2 can be increased; on the contrary, in order to reduce the shading width, the second clock signal CK2 at the high level can be generated with delay or the duty cycle of the second clock signal CK2 can be reduced.

In addition, a shading slope rate of the shading portion SH is positively correlated to a discharge capability, a voltage conversion rate or an element size of the second switch M2 and the third switch M3.

For example, in order to make the shading slope rate of the shading portion SH steeper, the second switch M2 having a strong discharge capability or a fast voltage conversion rate can be chosen for use or the third switch M3 having a small conduction impedance can be chosen for use (to strengthen a capability of pulling down); on the contrary, in order to make the shading slope rate of the shading portion SH gentler, the second switch M2 having a weak discharge capability or a slow voltage conversion rate can be chosen for use or the third switch M3 having a large conduction impedance can be chosen for use.

In the embodiment, the second switch M2 has a larger influence on the shading slope rate of the output signal than the third switch M3.

Figure 5:
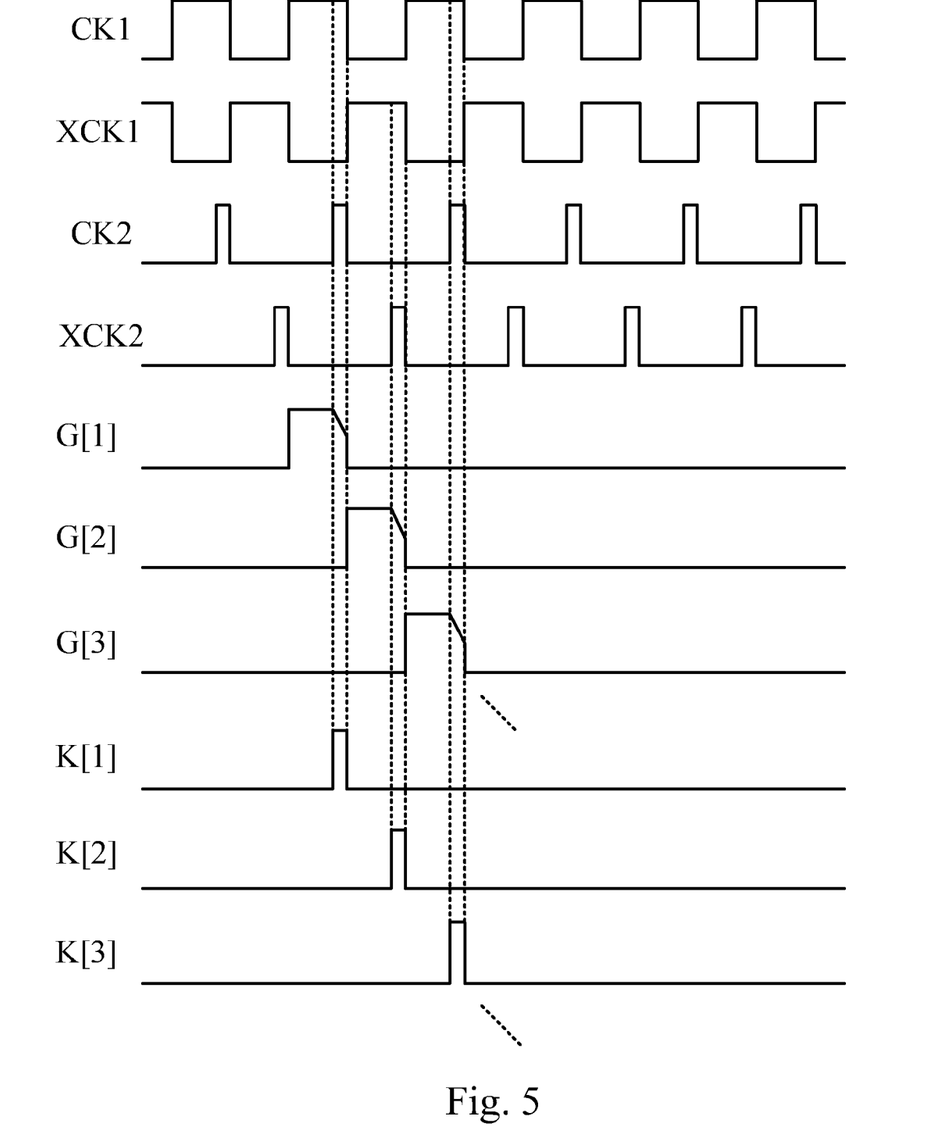
FIG. 5 illustrates a signal waveform diagram related to three shift registers in the shift register circuit in FIG. 2.

Referring to FIG. 5 at the same time, it illustrates a signal waveform diagram related to the shift registers SR[1], SR[2] and SR[3] in the shift register circuit 100.

Additionally, it is supplemented that in practical use, in order to simplify the circuit structure or reduce the updating frequency necessary for the clock signal, two sets of antiphase clock signals can be used in the shift register circuit 100 to drive the adjacent stages of the shift registers respectively. For example, two antiphase clock signals are used at an odd number stage and an even number stage respectively and the like. Therefore, as shown in FIG. 5, the first clock signal includes the antiphase clock signals CK1 and XCK1. The second clock signal includes the antiphase clock signals CK2 and XCK2.

For the example of FIG. 5, the odd stages of the shift registers SR[1], SR[3] and the like can be operated based on the first clock signal CK1 and the second clock signal CK2; the even stages of the shift registers SR[2] and the like can be operated based on the antiphase first clock signal XCK1 and the antiphase second clock signal XCK2. The operational method of the antiphase first clock signal XCK1 and the antiphase second clock signal XCK2 can be inferred from the above embodiments and it will not be described herein anymore.

Figure 6:
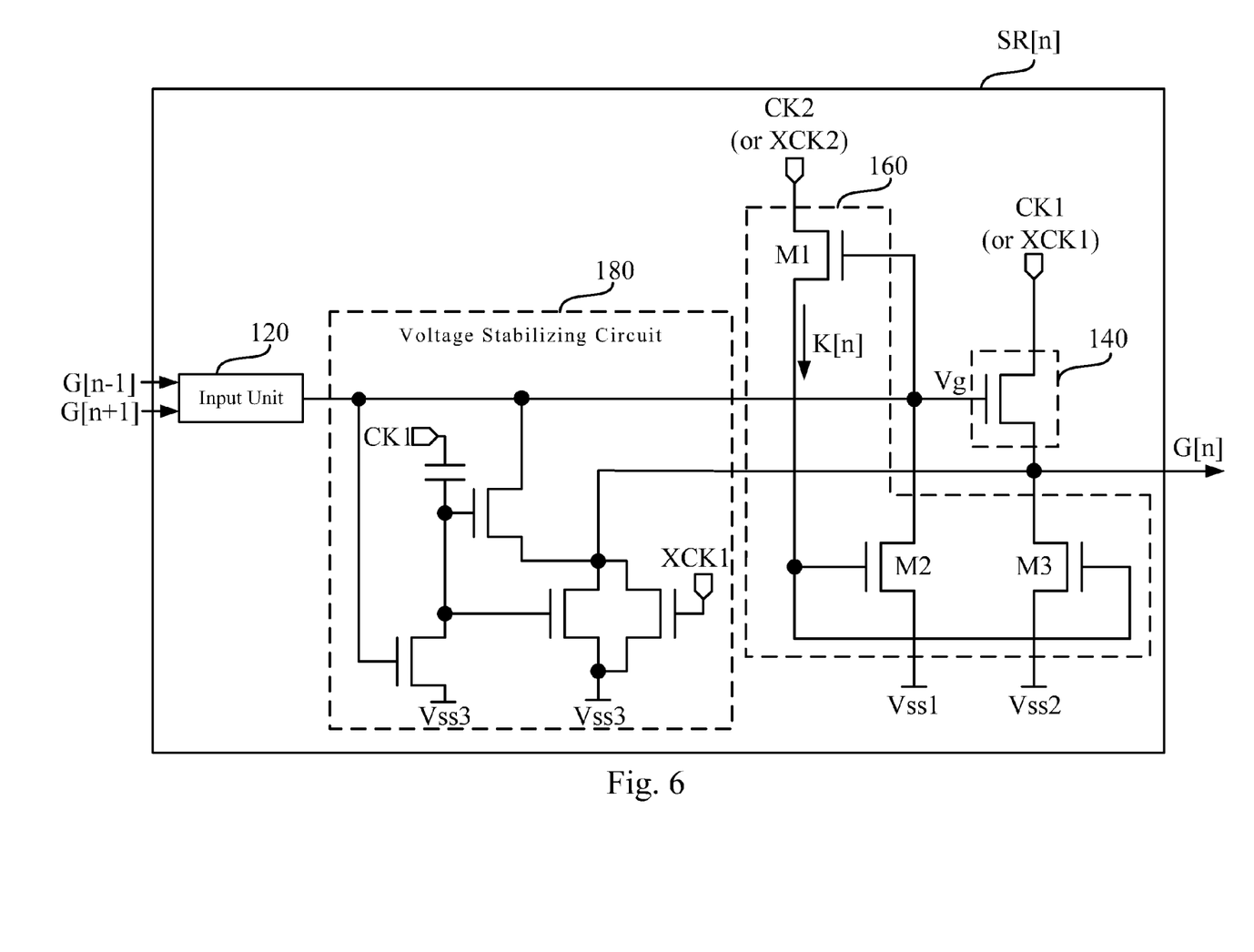
FIG. 6 illustrates an internal circuit schematic view of the shift register of FIG. 3 in an embodiment.

Referring to FIG. 6 at the same time, it illustrates an internal circuit schematic view of the shift register SR[n] of FIG. 3 in an embodiment. As shown in FIG. 6, the voltage stabilizing circuit 180 in the shift register SR[n] is electrically coupled to the gate terminal of the output transistor 140 and the second terminal of the output transistor 140.

In addition, the voltage stabilizing circuit 180 receives the first clock signal (such as the forward first clock signal CK1 and the reverse first clock signal CK1). When the stage of the shift register SR[n] is not activated, the voltage stabilizing circuit 180 is configured for maintaining the gate terminal of the output transistor 140 and the output signal G[n] of the stage at the low voltage level. For example, in FIG. 4, when the shift register SR[n] is not activated before the time point T0 and after the time point T3, at this time, the voltage stabilizing circuit 180 is configured for maintaining the voltage Vg on the gate terminal at the low voltage level (the gate terminal of the output transistor 140) and maintaining the output signal G[n] of the stage at the low voltage level (the output terminal of the output transistor 140).

The circuit elements shown in FIG. 6 consist of the internal elements of the voltage stabilizing circuit 180 in one embodiment. Through the structure of the circuit elements shown in FIG. 6, when the stage of the shift register SR[n] is not activated, the gate terminal of the output transistor 140 (such as the voltage Vg on the gate terminal in FIG. 4) and the output signal G[n] of the stage are maintained at the low voltage level. However, the invention is not only limited to the structure of the circuit elements shown in FIG. 6, also including the equivalent circuit structures having the similar function.

Figure 7:
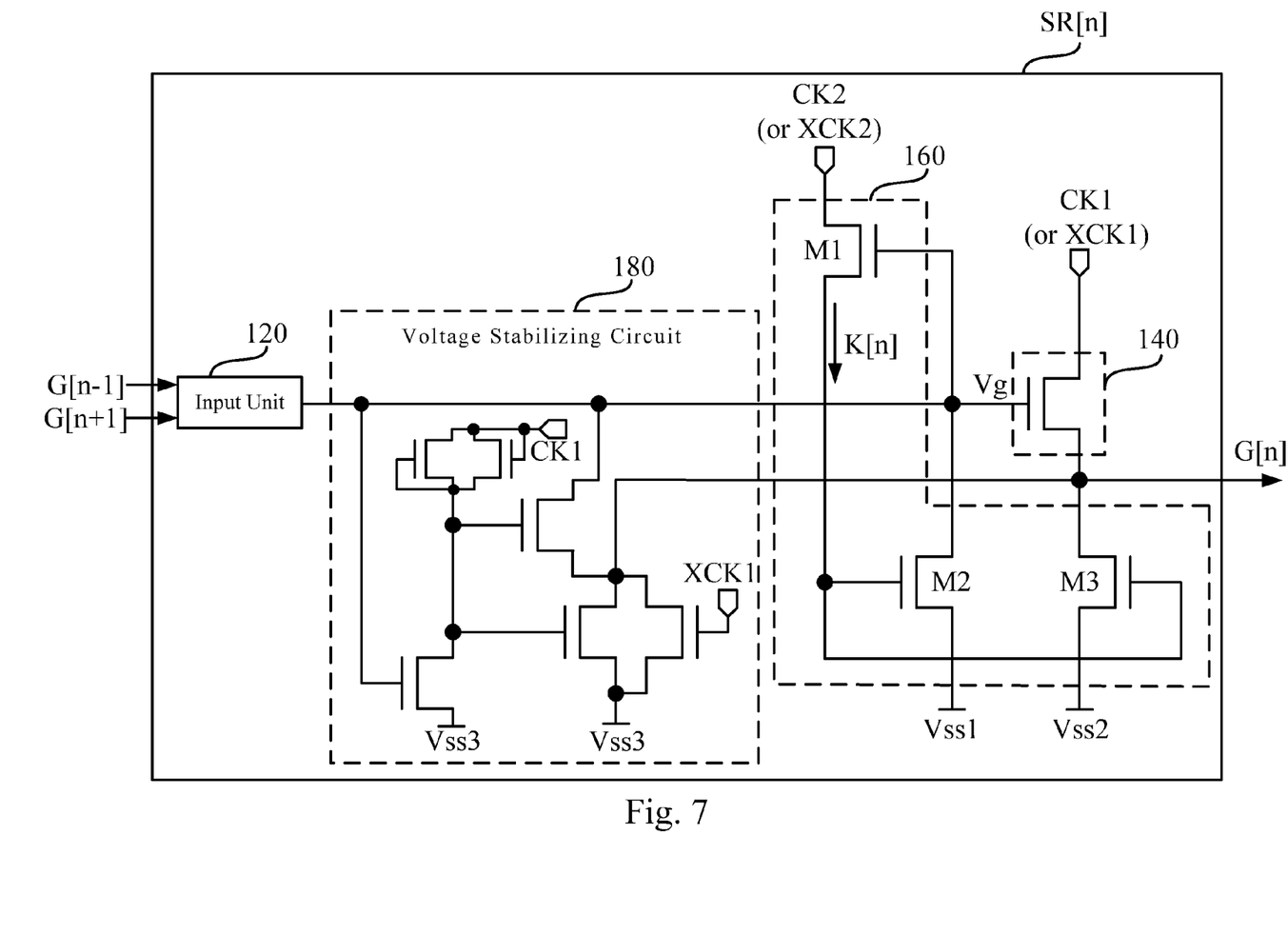
FIG. 7 illustrates an internal circuit schematic view of the shift register of FIG. 3 in another embodiment.

Referring to FIG. 7 at the same time, it illustrates an internal circuit schematic view of the shift register SR[n] of FIG. 3 in another embodiment. As shown in FIG. 7, the voltage stabilizing circuit 180 in the shift register SR[n] is electrically coupled to the gate terminal of the output transistor 140 (such as the voltage Vg on the gate terminal in FIG. 4) and the second terminal of the output transistor 140. The voltage stabilizing circuit 180 shown in FIG. 7 also can reach a similar effect.

In addition, the gradual stage of bi-direction scan shifting of the shift register circuit 100 is exemplified for description, which is illustrated in the aforesaid embodiments. The input unit 120 of each stage of the shift register SR[n] is electrically coupled to the output signal G[n−1] of the previous stage of the shift register and the output signal G[n+1] of the next stage of the shift register. However, the input unit 120 of each stage of the shift register G[n] is not limited to the coupling to the output signal G[n−1] of the previous stage of the shift register and the output signal G[n+1] of the next stage of the shift register.

The input unit 120 of each stage of the shift register SR[n] also can be electrically coupled to the output signal of a stage of the shift register M stages before and the output signal of a stage of the shift register N stages later, e.g., G[n−M] and G[n+N] (not shown), wherein M and N are positive integers. In this way, the forward scan shifting jumping a stage is formed. For example, when M=2, the input unit 120 of the third stage of the shift register SR[3] can be connected to the output signal G[1] of the first stage of the shift register SR[1] directly. The rest can be done in the same manner.

On the other hand, the invention is not limited to the bi-direction scan shifting. In other embodiments, the invention also can be a unidirection scan shifting (such as the forward or reverse scan shifting). The input unit of each stage of the shift register at least is connected to the output signal of another stage of the shift register. For example, the input unit of each stage of the shift register can be electrically coupled to the previous stage of the shift register or a stage of the shift register M stages before to form the shift register circuit of the forward scan shifting, wherein M is a positive integer.

Figure 8A:
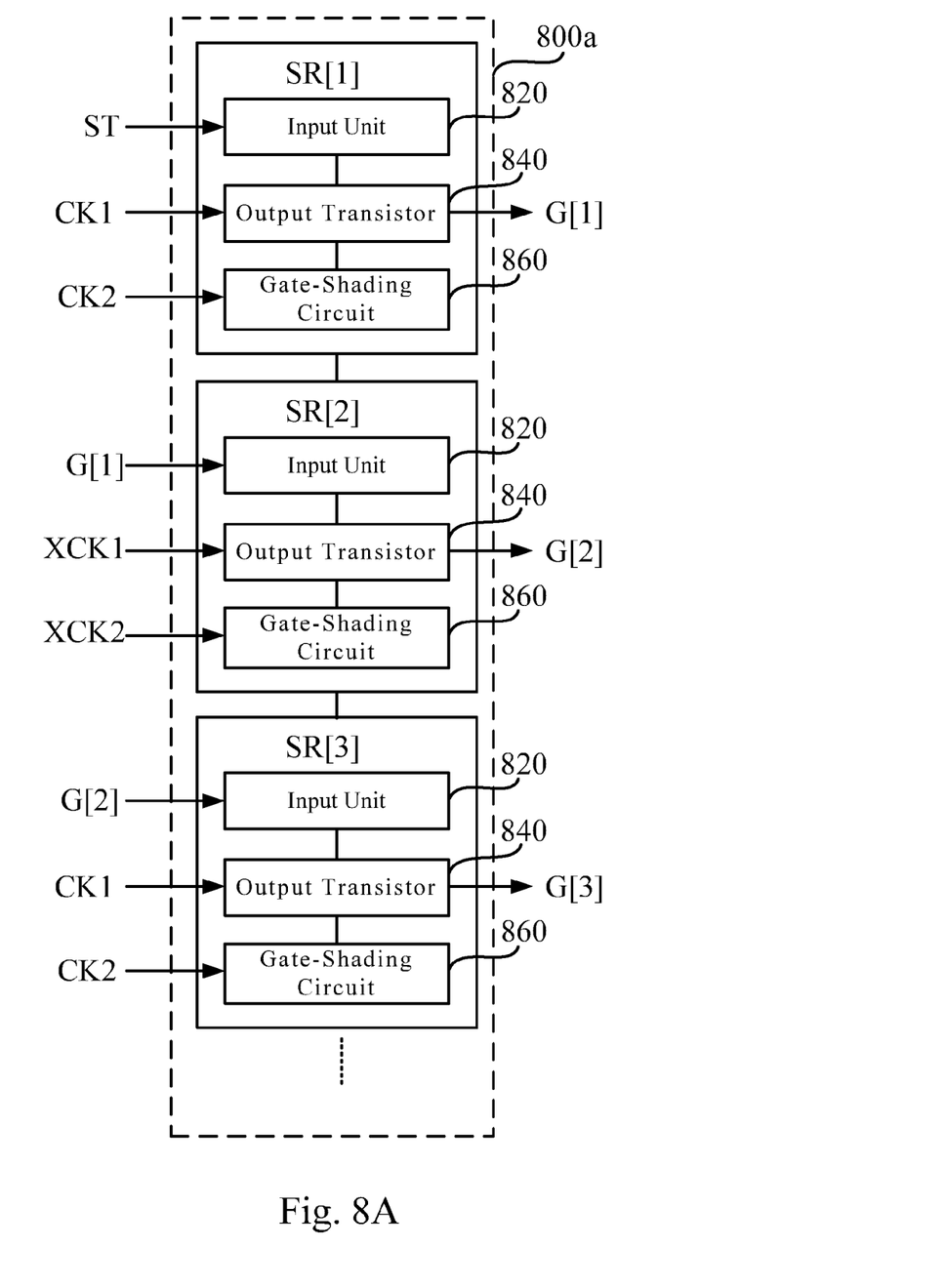
FIG. 8A illustrates a schematic view of a shift register circuit according to an embodiment of the invention.

Referring to FIG. 8A at the same time, it illustrates a schematic view of a shift register circuit 800a according to an embodiment of the invention. In the shift register circuit 800a, an input unit 820 of the shift register SR[2] is electrically coupled to the output signal G[1] of the previous stage of the shift register SR[1]; the input unit 820 of the shift register SR[3] is electrically coupled to the output signal G[2] of the previous stage of the shift register SR[2]. Inferring from this, the shift register circuit 800a of the forward scan shifting can be formed.

In addition, the input unit of each stage of the shift register can be electrically coupled to the next stage of the shift register or a stage of the shift register N stages later to form the shift register circuit of the reverse scan shifting, wherein N is a positive integer.

Figure 8B:
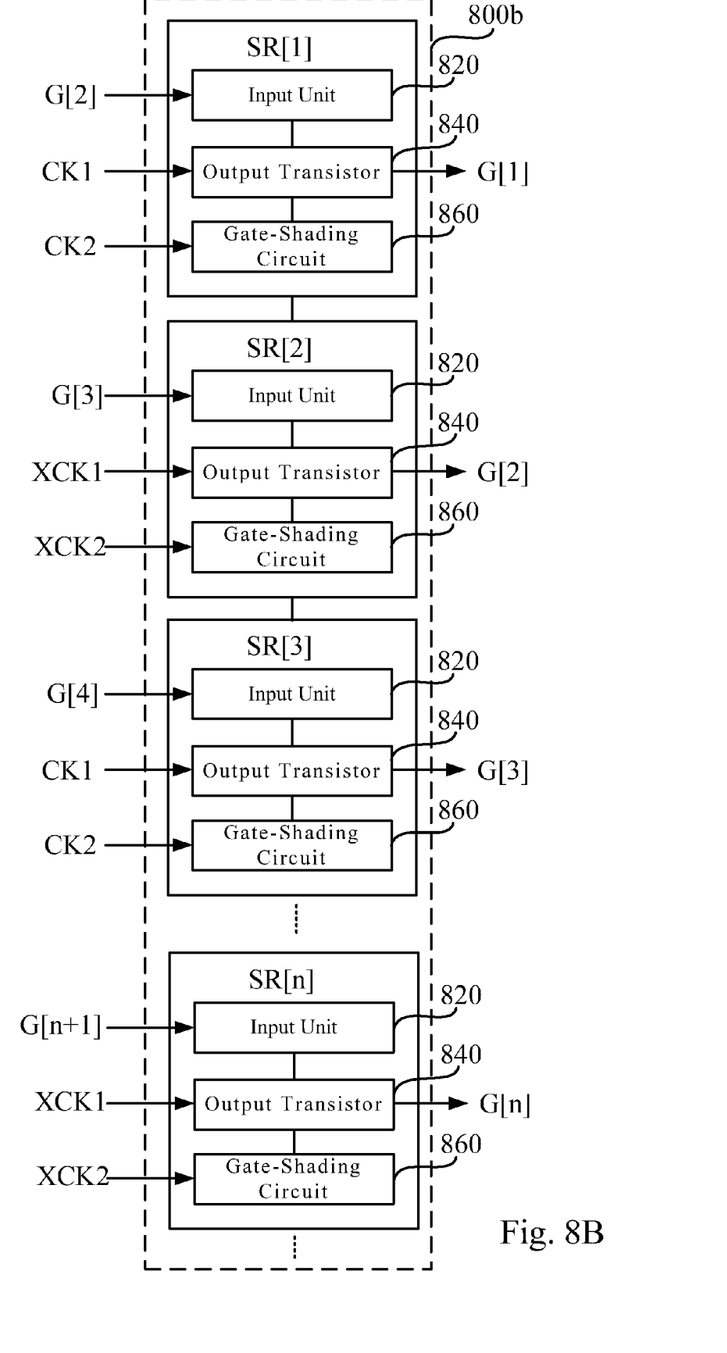
FIG. 8B illustrates a schematic view of a shift register circuit according to another embodiment of the invention.

Referring to FIG. 8B at the same time, it illustrates a schematic view of a shift register circuit 800b according to an embodiment of the invention. In the shift register circuit 800b, the input unit 820 of the shift register SR[1] is electrically coupled to the output signal G[2] of the next stage of the shift register SR[2]; the input unit 820 of the shift register SR[2] is electrically coupled to the output signal G[3] of the next stage of the shift register SR[3]. Inferring from this, the shift register circuit 800b of the reverse scan shifting can be formed.

In view of the above, when the second switch and the third switch in the gate-shading circuit of each stage of the shift register of the disclosure are turned on, they can pull down the gate terminal and the output terminal (i.e., the second terminal) of the output transistor respectively to form the shading on the output signal efficiently. In addition, when each stage of the shift register is not activated, the voltage stabilizing circuit exists to ensure the signal stabilization to avoid errors taking place.

Although the invention has been disclosed with reference to the above embodiments, these embodiments are not intended to limit the invention. Those of skills in the art can make various modifications and changes without departing from the spirit and scope of the invention. Therefore, the scope of the invention should be defined by the appended claims.

What is claimed is:
1. A shift register circuit, comprising:
a plurality of stages of shift registers, each of the plurality of stages of the shift registers comprising:
an output transistor, having a first terminal, a second terminal and a gate terminal, the first terminal of the output transistor being configured to receive a first clock signal, the second terminal of the output transistor being configured for generating an output signal of a present stage of the shift register and providing the output signal to a next stage and/or a previous stage of the shift register; and
a gate-shading circuit, comprising:
a first transistor, having a first terminal, a second terminal and a gate terminal, the first terminal of the first transistor being configured for directly receiving a second clock signal, the gate terminal of the first transistor being directly electrically coupled to the gate terminal of the output transistor, receiving a voltage level of the gate terminal of the output transistor and being for controlling whether to conduct or cutoff between the first terminal and the second terminal of the first transistor according to the voltage level of the gate terminal of the output transistor;
a second switch, having a first terminal, a second terminal and a gate terminal, wherein the first terminal of the second switch is electrically coupled to the gate terminal of the output transistor, the second terminal of the second switch is configured for receiving a first reference voltage and the gate terminal of the second switch is electrically coupled to the second terminal of the first transistor; and
a third switch, having a first terminal, a second terminal and a gate terminal, wherein the first terminal of the third switch is electrically coupled to the second terminal of the output transistor, the second terminal of the third switch is configured for receiving a second reference voltage, and the gate terminal of the third switch is electrically coupled to the second terminal of the first transistor,
wherein the first transistor is configured to control the second switch, in response to the second clock signal, to pull down the voltage level of the gate terminal of the output transistor from a boost voltage level, which is logically higher than a first voltage level turning on the output transistor.
2. The shift register circuit of claim 1, further comprising an input unit configured for controlling the gate terminal of the output transistor, wherein the input unit is electrically coupled to the previous stage of the shift register, the output signal of the present stage of the shift register is provided to the next stage of the shift register, the shift register circuit is forward scan shifting.

3. The shift register circuit of claim 1, further comprising an input unit configured for controlling the gate terminal of the output transistor, wherein the input unit is electrically coupled to the next stage of the shift register, the output signal of the present stage of the shift register is provided to the previous stage of the shift register, the shift register circuit is reverse scan shifting.

4. The shift register circuit of claim 1, further comprising an input unit configured for controlling the gate terminal of the output transistor, wherein the input unit is electrically coupled to the previous stage and the next stage of the shift register.

5. The shift register circuit of claim 1, wherein each of the plurality of stages of the shift registers further comprises a voltage stabilizing circuit electrically coupled to the gate terminal of the output transistor and the second terminal of the output transistor, wherein when the present stage of the shift register is not activated, the voltage stabilizing circuit is configured for maintaining the gate terminal of the output transistor and the output signal of the present stage of the shift register at a low voltage level.

6. The shift register circuit of claim 1, wherein a pulse width of the second clock signal is positively correlated to a shading width of shading of the output signal.

7. The shift register circuit of claim 6, wherein a shading slope rate of the output signal is positively correlated to a discharge capability, a voltage conversion rate and/or a conduction impedance of the second switch and the third switch.

8. The shift register circuit of claim 1, wherein a shading slope rate of the output signal is positively correlated to a discharge capability, a voltage conversion rate and/or a conduction impedance of the second switch and the third switch.

9. The shift register circuit of claim 1, wherein the second switch pulls down the voltage level of the gate terminal of the output transistor from the boost voltage level to form shading on the output signal.

10. The shift register circuit of claim 1, wherein a wave width of the second clock signal is different from a wave width of the first clock signal.

11. A shift register circuit, comprising:
a plurality of stages of shift registers, wherein each of the plurality of stages of the shift registers comprises:
an output transistor, configured for generating an output signal of a present stage of the shift register on a second terminal of the output transistor according to a voltage level on a gate terminal of the output transistor and a voltage level on a first terminal of the output transistor;
an input unit, electrically coupled to the output transistor and configured for controlling the voltage level on the gate terminal of the output transistor;
a gate-shading circuit, comprising:
a first transistor, directly electrically coupled to the gate terminal of the output transistor, receiving the voltage level on the gate terminal of the output transistor, and configured to output a control signal according to the voltage level on the gate terminal of the output transistor and a voltage level on a first terminal of the first transistor;
a second switch, electrically coupled to the gate terminal of the output transistor and configured for pulling down the voltage level on the gate terminal of the output transistor according to the control signal; and a third switch, electrically coupled to the output transistor, and configured to pull down a voltage level on the second terminal of the output transistor according to the control signal, wherein the first terminal of the first transistor is directly receiving a second clock signal and is configured to control the second switch, in response to the second clock signal, to pull down the voltage level on the gate terminal of the output transistor from a boost voltage level, which is logically higher than a first voltage level turning on the output transistor; and
a voltage stabilizing circuit, electrically coupled to the gate terminal of the output transistor and the second terminal of the output transistor, wherein when the present stage of the shift register is not activated, the voltage stabilizing circuit is configured for maintaining the gate terminal of the output transistor and the output signal of the present stage of the shift register at a low voltage level.

12. The shift register circuit of claim 11, wherein the second switch has a first terminal, a second terminal and a gate terminal;
the first terminal of the second switch is electrically coupled to the gate terminal of the output transistor, the second terminal of the second switch is configured for receiving a first reference voltage and the gate terminal of the second switch is configured to receive the control signal.

13. The shift register circuit of claim 12, wherein the first transistor has a first terminal, a second terminal and a gate terminal;
the first terminal of the first transistor is configured for receiving the second clock signal, the gate terminal of the first transistor is electrically coupled to the gate terminal of the output transistor for controlling whether to conduct or cutoff between the first terminal and the second terminal of the first transistor according to the voltage level on the gate terminal of the output transistor.

14. The shift register circuit of claim 13, wherein the third switch has a first terminal, a second terminal and a gate terminal;
the first terminal of the third switch is electrically coupled to the second terminal of the output transistor, the second terminal of the third switch is configured for receiving a second reference voltage, and the gate terminal of the third switch is electrically coupled to the second terminal of the first transistor.

15. The shift register circuit of claim 11, wherein the first transistor has a first terminal, a second terminal and a gate terminal;
the first terminal of the first transistor is configured for receiving a second clock signal, the gate terminal of the first transistor is electrically coupled to the gate terminal of the output transistor for controlling whether to conduct or cutoff between the first terminal and the second terminal of the first transistor according to the voltage level on the gate terminal of the output transistor.

16. The shift register circuit of claim 15, wherein the third switch has a first terminal, a second terminal and a gate terminal;
the first terminal of the third switch is electrically coupled to the second terminal of the output transistor, the second terminal of the third switch is configured for receiving a second reference voltage, and the gate terminal of the third switch is electrically coupled to the second terminal of the first transistor.

17. The shift register circuit of claim 11, wherein a pulse width of the second clock signal is positively correlated to a shading width of shading of the output signal.

18. The shift register circuit of claim 17, wherein a shading slope rate of the output signal is positively correlated to a discharge capability, a voltage conversion rate and/or a conduction impedance of the second switch and the third switch.

19. The shift register circuit of claim 11, wherein a shading slope rate of the output signal is positively correlated to a discharge capability, a voltage conversion rate and/or a conduction impedance of the second switch and the third switch.

20. The shift register circuit of claim 11, wherein a wave width of the second clock signal is different from a wave width of the first clock signal.

21. A shading waveform generating method, comprising:
providing a shift register circuit comprising a plurality of stages of shift registers, wherein each of the plurality of stages of the shift registers comprises:
an output transistor, configured for generating an output signal of a present stage of the shift register on a second terminal of the output transistor according to a voltage level on a gate terminal of the output transistor and a voltage level on a first terminal of the output transistor;
an input unit, electrically coupled to the output transistor and configured for controlling the voltage level on the gate terminal of the output transistor;
a gate-shading circuit, comprising:
a first transistor, directly electrically coupled to the gate terminal of the output transistor, receiving the voltage level on the gate terminal of the output transistor, and configured to output a control signal according to the voltage level on the gate terminal of the output transistor and a voltage level on a first terminal of the first transistor;
a second switch, electrically coupled to the gate terminal of the output transistor and configured for pulling down the voltage level on the gate terminal of the output transistor according to the control signal; and
a third switch, electrically coupled to the output transistor, and configured to pull down a voltage level on the second terminal of the output transistor according to the control signal, wherein the first terminal of the first transistor is directly receiving a second clock signal and is configured to control the second switch, in response to the second clock signal, to pull down the voltage level of the gate terminal of the output transistor from a boost voltage level, which is logically higher than a first voltage level turning on the output transistor logic high level of the output signal, when the output signal is at the logic high level; and
a voltage stabilizing circuit, electrically coupled to the gate terminal of the output transistor and the second terminal of the output transistor, wherein when the present stage of the shift register is not activated, and the voltage stabilizing circuit is configured for maintaining the gate terminal of the output transistor and the output signal of the present stage of the shift register at a low voltage level;
turning on the output transistor of the present stage of the shift register and pulling up a voltage level of the second terminal of the output transistor through a first clock signal;
turning on the second switch by the first transistor through the second clock signal to reduce a conductive degree of the output transistor; and
turning on the third switch by the first transistor through the second clock signal.

22. The shading waveform generating method of claim 21, comprising:
increasing the gate terminal of the output transistor of the present stage of the shift register to a first voltage level through the output signal outputted by a previous stage of the shift register, to conduct the output transistor of the present stage of the shift register when the previous stage of the shift register is activated; and
generating the output signal by transmitting the first clock signal through the output transistor to the second terminal of the output transistor when the present stage of the shift register is activated, and increasing the gate terminal of the output transistor from the first voltage level to a boost voltage level through a coupling capacitance.

* * * * *